United States Patent [19]

Koyama et al.

[11] Patent Number: 5,127,365

[45] Date of Patent: Jul. 7, 1992

[54] VERTICAL HEAT-TREATMENT APPARATUS FOR SEMICONDUCTOR PARTS

[75] Inventors: Mitsutoshi Koyama, Tokyo; Koichi Takahashi, Kawasaki; Hironori Sonobe, Tokyo, all of Japan

[73] Assignee: Kabushiki Kaisha Toshiba, Kawasaki, Japan

[21] Appl. No.: 659,274

[22] Filed: Feb. 22, 1991

[30] Foreign Application Priority Data

Feb. 27, 1990 [JP] Japan .................. 2-46308

[51] Int. Cl.5 .................................... H01L 21/00
[52] U.S. Cl. .................................. 118/724; 118/715; 118/730; 118/733; 219/390; 219/405; 219/411
[58] Field of Search ............... 219/390, 405, 411; 118/715, 724, 730, 733

[56] References Cited

U.S. PATENT DOCUMENTS

| 4,501,766 | 2/1985 | Suzuki et al. ............ | 118/730 |
| 4,950,870 | 8/1990 | Mitsuhashi et al. ........ | 219/411 |
| 4,989,540 | 2/1991 | Fuse et al. .............. | 118/724 |

Primary Examiner—David A. Simmons
Assistant Examiner—George A. Goudreau
Attorney, Agent, or Firm—Finnegan, Henderson, Farabow, Garrett and Dunner

[57] ABSTRACT

A heat-treatment apparatus includes a quartz heat-treatment tube having a vertically set axis in which a heat-treatment gas is supplied from its lower portion, and a quartz cap to be mounted on an upper opening portion of the heat-treatment tube. An opening is formed in a central portion of the cap, a quartz rod is inserted through the opening along the axis of the heat-treatment tube, and semiconductor parts to be heat-treated are held by the rod. A first exhaust duct is formed in a side surface of the heat-treatment tube at a position higher than at least the semiconductor parts held by the rod and exhausts the heat-treatment gas in the heat-treatment tube. A ring-like chamber open toward the inner surface of the cap is formed in the outer circumferential surface of the heat-treatment tube in a position close to the upper opening surface, and a second exhaust duct communicates with this chamber. The chamber communicates with the opening portion formed in the cap in the outer circumferential portion of the rod and communicates with the interior of the heat-treatment tube, thereby exhausting an external air drawn from the opening together with the heat-treatment gas in the heat-treatment tube.

13 Claims, 3 Drawing Sheets

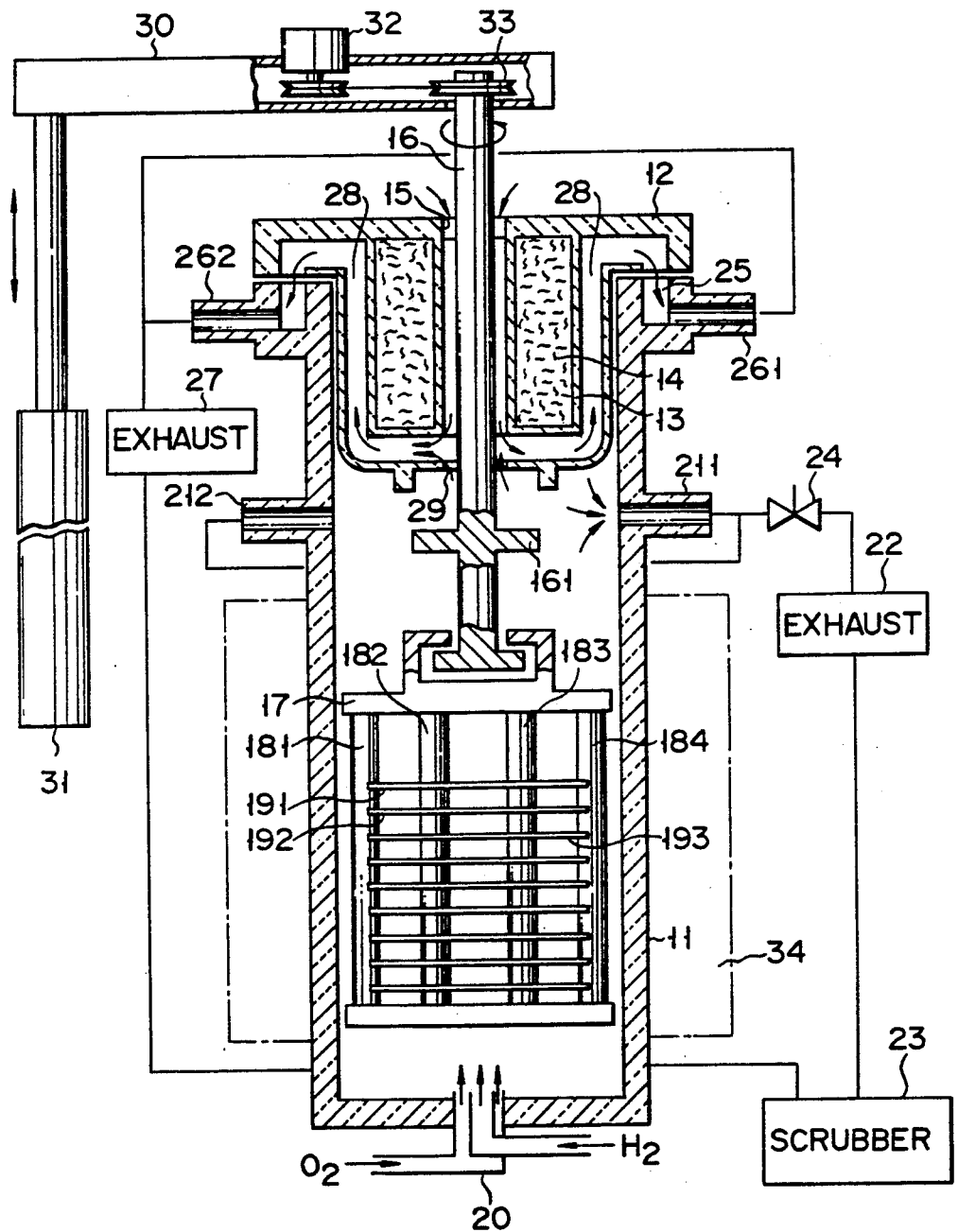
F I G. 1

VERTICAL HEAT-TREATMENT APPARATUS FOR SEMICONDUCTOR PARTS

BACKGROUND OF THE INVENTION

1. Field of the Invention

The present invention relates to a heat-treatment apparatus for heat-treating a semiconductor part such as a semiconductor element or a semiconductor wafer in a predetermined gas atmosphere and, more particularly, to a vertical heat-treatment apparatus for vertically stacking semiconductor parts to be heat-treated and inserting the parts from the above into a furnace for performing a heat-treatment.

2. Description of the Related Art

A horizontal heat-treatment apparatus is known as an apparatus for heat-treating a plurality of semiconductor wafers. This heat-treatment apparatus is constituted by a heat-treatment tube horizontally set to receive a reaction gas for a heat-treatment therein. A plurality of vertically set semiconductor wafers are horizontally inserted in the heat-treatment tube, and the tube is heated by an externally set heater mechanism.

As semiconductor wafer manufacturing techniques have progressed, however, the size of a semiconductor wafer has been increased. When semiconductor wafers having such a large size are vertically set, it is difficult to control a reaction gas to uniformly act on the surfaces of the semiconductor wafers and to increase a space efficiency in a heat-treatment tube.

In a vertical heat-treatment apparatus, it is easy to control the reaction gas and to increase the space efficiency. Therefore, there is the trend that vertical heat-treatment apparatuses are used in increasing numbers.

A characteristic feature of such a vertical heat-treatment apparatus is that a mechanism for rotating a boat having a plurality of semiconductor wafers or the like thereon and placed in the heat-treatment tube can be used. That is, in a vertical heat-treatment apparatus of, e.g., a down-load type, a rod is inserted from above into a central axis portion of a vertically set heat-treatment tube, and a boat having a plurality of semiconductor wafers thereon is suspended from the lower end portion of the rod, thereby placing the semiconductor wafers in the heat-treatment tube. In this case, a plurality of horizontally set semiconductor wafers are vertically stacked with predetermined intervals therebetween and can be rotated in the horizontal plane by rotating the rod.

In most vertical heat-treatment tube of this type, a heat-treatment gas is supplied from a lower portion of the tube and exhausted from the above the boat mounting semiconductor wafers. If the rod suspending the boat mounting the horizontally set semiconductor wafers is rotated in this state, the semiconductor wafers are also rotated in respective horizontal planes. By performing a heat-treatment in this state, therefore, uniform characteristics can be easily obtained on the entire surface of each semiconductor wafer.

In such a vertical heat-treatment apparatus, a detachable cap is attached to an opening portion formed in the upper portion of the heat-treatment tube, and an opening for inserting the rod is formed in the central portion of the cap. The rod is inserted into the heattreatment tube through the central opening portion of the cap and rotated together with the boat suspended therefrom. It is, therefore, difficult to provide a seal at the opening portion of the cap for inserting the rod.

Alternatively, a structure in which the cap and the rod are integrally formed may be adopted. When a mechanism for rotating the rod with such a structure is adopted, the rod cannot be rotated while the cap is in contact with the opening surface of the heat-treatment tube since the rod and the cap are vertically moved with each other. Therefore, the rod is moved to a position at which the cap is slightly separated from the opening surface of the heat-treatment tube, and is rotated while a small gap is formed between the cap and the opening surface of the heat-treatment tube. In such a structure, therefore, it is more difficult to form an airtight structure between the opening surface of the heat-treatment tube and the cap.

In a vertical heat-treatment apparatus of an upload type, unlike in the down-load type apparatus as described above, a boat having semiconductor wafers thereon is mounted on a heat-insulating quartz base, and this heat-insulating quartz base is vertically moved by a lift mechanism using a ball screw, a chain driving mechanism, or a hydraulic cylinder. The semiconductor wafers are inserted from a bottom opening portion of the vertically set heat-treatment tube into the heattreatment tube.

When semiconductor wafers are to be set in the heat-treatment tube in this manner, a flange portion of the heat-insulating quartz base and a flange portion around the opening portion of the heat-treatment tube are controlled by using a position sensor mechanism to form a small gap of about 1 mm therebetween when they are stopped. In this state, the boat is rotated together with the heat-insulating quartz base by a rotating mechanism to improve heat-treatment characteristics.

In the up-load type heat-treatment apparatus having the above arrangement, when quartz materials of the heat-insulating quartz base and the heat-treatment tube are in slidable contact with each other by rotation control of the boat, particles are produced by friction therebetween. In order to prevent production of particles, therefore, a gap of about 1 mm is formed between the heat-insulating quartz base and the heat-treatment tube. As a result, it is difficult to form an air-tight structure in this portion.

In order to perform a heat-treatment for semiconductor wafers, a heat-treatment gas is supplied into the heat-treatment tube. Since a combustible gas or phosphorus oxychloride ($POCl_3$) or hydrogen chloride (HCl) gas which is harmful for a human body is used as the heat-treatment gas for semiconductor wafers, a care must be taken in handling of the gas or preventing a gas leakage to the outside. In addition, a care must be taken to prevent external air from flowing into the heat-treatment tube to degrade the internal atmosphere. For this reason, sealing structures between the heattreatment tube and the cap or the flange of the heatinsulating base and at the rod insertion portion are very important.

In such a vertical heat-treatment apparatus, the sealing portion is heated up to a temperature corresponding to the heat-treatment temperature, e.g., kept at a temperature as high as 200° C. to 300° C. In such a high-temperature state, the apparatus requires stable rotational motion of the rod, and needs to have a corrosion resistance with respect to the heat-treatment gas in contact, to be clean enough to prevent a metal gas or an organic gas from being mixed in the heattreatment gas, to remain free of particles properties. An example of the heat-treatment apparatus required to have the most strict characteristics is a diffusing system.

FIG. 4 shows a structure of a vertically arranged well-type heat-treatment apparatus to be used as, e.g., a diffusing system, which has a cylindrical heattreatment tube 51 with a bottom for forming a heattreatment furnace. The tube 51 consists of quartz and has an opening in its upper portion. A cap 52 consisting of quartz is placed on the opening surface of the tube 51 by its own weight. A surface of the tube 51 to be in contact with the cap 52 is formed into a ground-in surface to prevent an air leakage from between the opening surface of the tube 51 and the cap 52 when the cap 52 is placed on the opening surface of the tube 51. A chamber 53 consisting of quartz is formed integrally with the cap 52 so as to be fitted inside the tube 51. Quartz wool 54 is housed in the chamber 53 to form a heat-insulating member.

An opening 55 is formed in the central portion of the cap 52. The opening 55 is formed through the chamber 53 from the upper surface of the cap 52 so as to coincide with the central axis of the tube 51. The rod 56 is inserted into the tube 51 through the opening 55. A boat 58 supporting a plurality of semiconductor wafers 571, 572, ..., is suspended from the lower end of the rod 56, and the semiconductors wafers 571, 572, ..., to be heat-treated are housed in a predetermined position of the tube 51 by the rod 56.

The rod 56 is supported by a lift mechanism (not shown) and vertically moved as indicated by an arrow shown in FIG. 4. The rod 56 is also rotated by a mechanism including a motor. When the rod 56 is moved upward from the position shown in FIG. 4, the cap 52 is also moved upward by a flange 561 formed integrally with the rod 56, thereby extracting the boat 58 supporting semiconductor wafers outside the tube 51. In addition, when the rod 56 is moved downward after semiconductor wafers are set on the boat 58, the rod 56 is set at a predetermined position in the tube 51, and the cap 52 is set on the opening surface of the tube 51.

Although not shown, a gas for forming a heattreatment atmosphere is supplied from the bottom portion of the tube 51, and an exhaust duct 59 is formed in the upper portion (above the boat 58) of the tube 51. An amount of the gas supplied into the tube 51 is controlled, and the gas is forcibly exhausted from the duct 59. A pressure difference is set between the internal and external pressures of the tube 51 by adjusting the exhaust amount, and this pressure difference is minimized.

In the heat-treatment apparatus having the above arrangement, a gap is formed between the opening 55 of the cap 52 and the rod 56 so as not to prevent vertical and rotational movements of the rod 56. Therefore, the interior of the tube 51 communicates with the external air through the opening 55. Therefore, a gas leakage from the opening 55 must be reliably prevented.

A seal for preventing such a gas leakage is provided by a gas, and a gas supply duct 60 for this purpose is formed at a position close to the cap 52 of the tube 51. This duct 60 communicates with a ring-like chamber 61 formed around the upper opening portion of the tube 51, and the chamber 61 communicates with a path 63 constituted by a ring-like gap formed around the circumferential surface of the rod 56 through a path 62 formed in the inner surface of the cap 52. This path 63 communicates with the opening 55 of the cap 52 and is open to the interior of the tube 51. Although only one each of the ducts 59 and 60 is shown in FIG. 3, a plurality each of ducts 59 and ducts 60 are formed at equal intervals on the outer circumferential surface of the tube 51. In addition, a plurality of paths 62 are radially formed around the opening 55.

A sealing gas which is harmless for a human body, has no problem in safety, and has high purity not contaminating a to-be-heat-treated object (semiconductor wafer) such as nitrogen or oxygen is supplied from the gas supply duct 60 and partially discharged outside through the opening 55. At the same time, the gas is supplied into the tube 51 through the paths 62 and 63 and exhausted from the exhaust duct 59. A flow of the sealing gas, therefore, prevents a flow of a gas inside the tube 51 toward the opening 55, thereby reliably preventing a leakage of a heat-treatment gas to outside the tube 51.

In such a sealing structure, however, the sealing gas also flows into the tube 51 into which the heattreatment gas is supplied, thereby adversely affecting the heat-treatment atmosphere. That is, the concentration of the heat-treatment gas inside the tube 51 is decreased by the sealing gas. This dilution of the heat-treatment gas occurs more conspicuously in an upper portion of the tube 51. In addition, although the total amount of the sealing gas supplied from the duct 60 can be controlled, a flow amount of the gas into the tube 51 cannot be controlled. An active gas concentration and the like in the tube 51, therefore, is changed due to a variation in flow amount of the sealing gas into the tube 51, and important parameters such as a formation rate of an oxide film formed on the surface of a semiconductor wafer are varied accordingly. For example, when a pyrogenic oxidation process in which oxygen and hydrogen as materials are burned to produce water and an oxide film is formed by the water is to be performed, not only a growth rate of the oxide film is decreased, but also it is difficult to control the growth rate. In addition, since positions of a large number of semiconductor wafers in the tube 51 are different from each other, oxide films are undesirably grown at different growth rates.

SUMMARY OF THE INVENTION

It is an object of the present invention to provide a heat-treatment apparatus for semiconductor parts, capable of reliably sealing a heat-treatment gas supplied into a heat-treatment tube and stably heattreating semiconductor parts without adversely affecting a heat-treatment gas atmosphere inside the heattreatment tube.

It is another object of the present invention to provide a heat-treatment apparatus capable of reliably controlling a growth rate of an oxide film in, e.g., an oxidation formation step without adversely affecting the concentration of a heat-treatment gas inside a heattreatment tube.

It is still another object of the present invention to provide a heat-treatment apparatus for semiconductor parts, capable of sealing a cap portion with a simple arrangement and reliably ensuring safety of the sealing without using and specific sealing gas.

According to a heat-treatment apparatus for semiconductor parts of the present invention, the axis of a cylindrical heat-treatment tube is vertically set, a rod suspending semiconductor parts is inserted from the upper portion or the lower portion of the heat-treatment tube along the axis, and a heat-treatment gas is supplied from the lower portion of the heat-treatment tube. A first exhausting means is provided to exhaust the gas in the heat-treatment tube from the upper portion or the lower portion of the tube, and a second exhausting means is formed at a position close to a heat-insulating cap set on an opening portion of the heat-treatment tube. This exhausting means communicates with a gas path formed in the heat-insulating cap portion to communicate with the external air, and also communicates with the interior of the heat-treatment tube.

In the heat-treatment apparatus having the above arrangement, the second exhausting means is formed at the cap portion of the heat-treatment tube requiring a sealing structure and communicates with the gas path which communicates with the external air at the cap portion. When the external air is drawn from this exhausting means therefore, the external air is exhausted together with the gas in the heat-treatment tube from the gap path to reliably prevent the gas in the heat-treatment tube from being discharged in the air. As a result, not only sealing of the heat-treatment tube is reliably performed, but also the concentration of a heat-treatment gas is uniformly and stably controlled in the heat-treatment tube, thereby easily and reliably controlling a heat-treatment characteristic.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional view for explaining an arrangement of a neat-treatment apparatus for semiconductor parts according to a first embodiment of the present invention;

DETAILED DESCRIPTION OF THE PREFERRED EMBODIMENTS

Figure 2:
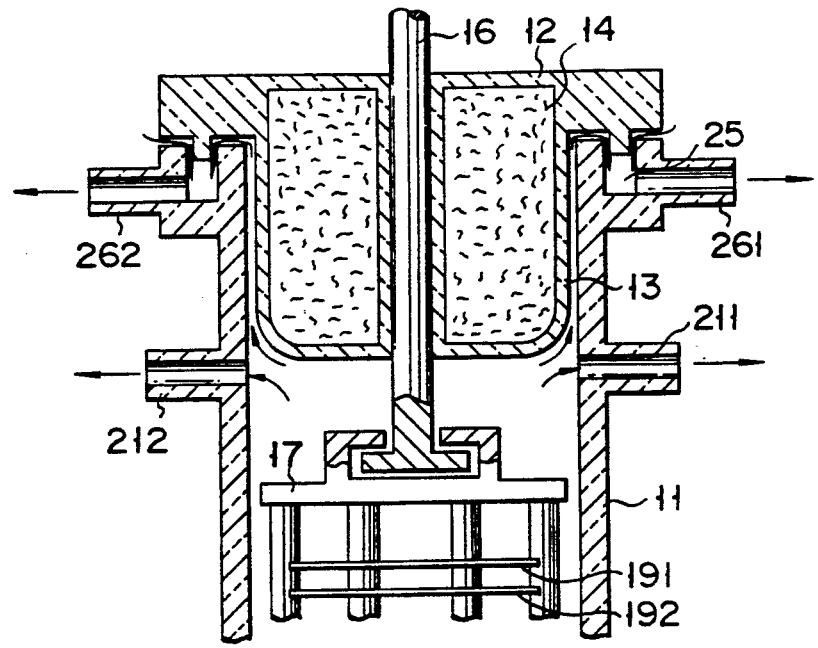
FIG. 2 is a sectional view for explaining a second embodiment of the present invention.

FIG. 1 shows a vertical heat-treatment apparatus of a down-load type in which a boat rotating mechanism is placed and, more specifically, a diffusing system for semiconductor parts such as semiconductor wafers. This apparatus comprises a cylindrical quartz heat-treatment tube 11 having a bottom, and a cap 12 also consisting of quartz is placed in an upper opening portion of the tube 11 by its own weight. The opening surface of the tube 11 and a contact surface of the cap 12 are air-tightly in contact with each other by grinding. A quartz chamber 13 is integrally formed on the inner surface of the cap 12, and quartz wool 14 is filled inside the chamber 13 to form a heat-insulating structure. When the cap 12 is set to close the opening portion of the tube 11, the chamber 13 is inserted into the tube 11.

An opening 15 which communicates with the interior of the tube 11 through the chamber 13 is formed in the central portion of the cap 12. A quartz rod 16 is inserted in the opening 15 and set in a position which coincides with the central axis of the tube 11. A boat 17 is suspended from the lower end of the rod 16. A plurality of support columns 181, 182, . . . , are formed to extend downward from the boat 17, and a plurality of semiconductor parts, i.e., semiconductor wafers 191, 192, . . . , are horizontally set at predetermined intervals therebetween such that their circumferential surfaces are held by the support columns 181, 182, . . .

An injector 20 for supplying a heat-treatment gas is open in the bottom portion of the tube 11 and supplies of hydrogen gas and oxygen gas as the heat-treatment gas when an oxide film is to be formed. A plurality of (e.g., six) exhaust ducts 211, 212, . . . , are formed at equal intervals in the upper portion of the tube 11. When the heat-treatment gas supplied from the injector 20 is filled in the tube 11, a gas in the tube 11 is exhausted from the ducts 211, 212, . . .

The heat-treatment gas is supplied from the injector 20 in an amount predetermined per unit time. An exhaust mechanism 22 communicates with the exhaust ducts 211, 212, . . . , and forcibly exhausts a gas inside the tube 11 into a scrubber 23. An exhaust amount from the ducts 211, 212, . . . , is controlled by a control valve 24 such that a difference between the internal and external pressures of the tube 11 is set at a predetermined pressure. The scrubber 23 removes heat-treatment gas components and discharges safe gas components outside the apparatus.

A ring-like chamber 25 which is open toward the cap 12 is formed around the upper opening portion of the tube 11, and a plurality of exhaust ducts 261, 262, . . . , are open in the chamber 25. The ducts 261, 262, . . . , are arranged at equal intervals around the tube 11, and a gas is exhausted from the ducts by an exhaust mechanism 27. The exhaust gas is supplied to the scrubber 23.

The ring-like chamber 25 communicates with the opening 15 portion formed to surround the rod 16 through an exhaust path 28 formed in the cap 12 and then communicates with the interior of the tube 11 through a path 29. External air is drawn from the exhaust ducts 261, 262, . . . , through the opening 15, and a gas inside the tube 11 is drawn and exhausted through the path 29.

The upper end of the rod 16 is held by a support member 30 which is vertically moved by a lift mechanism 31 constituted by a hydraulic cylinder or a ball screw. When the rod 16 is moved upward by the lift mechanism 31, therefore, the cap 12 is supported by a flange 161 formed integrally with the rod 16, and the boat 17 is loaded out from inside the tube 11 together with the cap 12. In addition, a motor 32 is mounted on the support member 31. A rotation of the motor 32 is transmitted to a pulley 33 integrally mounted on the rod 16 via a belt to rotate the rod 16 together with the boat 17.

A heating mechanism 34 constituted by winding an electric heating wire or the like on the outer circumferential surface of a heat tube is arranged around the quartz heat-treatment tube 11 to set a predetermined heat-treatment temperature in the tube 11.

In the diffusing system having the above arrangement, a heat-treatment gas is supplied from the injector 20 into the tube 11 at a predetermined flow rate and exhausted from the exhaust ducts 211, 212, . . . This exhaust rate is controlled by the control valve 24 such that the pressure in the tube 11 is almost set at the atmospheric pressure. More specifically, the pressure in the tube 11 is set to be slightly lower than the atmospheric pressure on the basis of the fact that the heat-treatment gas in the tube 11 can be exhausted from the exhaust ducts 211, 212, . . . , and 261, 262, . . . , when the pressure in the ducts 211, 212, . . . , is set at a value (15 mmAq) lower by about 15 mm than a water column of 10 m. For this reason, a leakage of the heat-treatment gas in the tube 11 from the opening 15 formed in the cap 12 and a ground-in portion between the cap 12 and the upper opening surface of the tube 11 can be reliably prevented, and these portions are reliably sealed.

In the above embodiment, the opening 15 is formed in the central portion of the cap 12, the rod 16 is inserted into the tube 11 through the opening 15, and the boat 17 holding semiconductor parts is rotated in a heat treatment process. The present invention, however, can be applied to an arrangement in which the rod 16 and the cap 12 are formed integrally with each other.

FIG. 2 shows the second embodiment of the present invention in which a rod 16 is mounted integrally with the central axis portion of a cap 12. That is the cap 12 is vertically moved together with the rod 16, and a gap communicating with the external air is not formed around the rod 16. In a heat-treatment apparatus having such a structure, after semiconductor wafers 191, 192, . . . , to be heat-treated are mounted on a boat 17 suspended from the rod 16, the rod 16 is inserted in a heat-treatment tube 11 until the cap 12 is moved close to the opening surface of the tube 11 by a distance of about 1 mm, and a preparation for a heat-treatment is completed.

Since the rotating cap 12 and the opening surface of the tube 11 are set with a predetermined interval (1 mm) therebetween so as not to produce particles by friction of quartz, no perfect air-tight structure can be formed. Therefore, a heat-treatment gas in the tube 11 may leak from this portion.

In the apparatus of the second embodiment, therefore, a ring-like chamber 25 is formed around the opening surface of the tube 11 in a position close to the cap 12 so that the external air communicates the chamber 25 and with the interior of the tube 11 through the chamber 25. That is, a gas in the tube 11 is drawn to the chamber 25 through the exhaust from exhaust ducts 261, 262, . . . , and a flow of the external air is formed toward the ducts 261, 262, . . . , through the chamber 25, thereby reliably preventing a leakage of the heattreatment gas in the tube 11.

Figure 4:
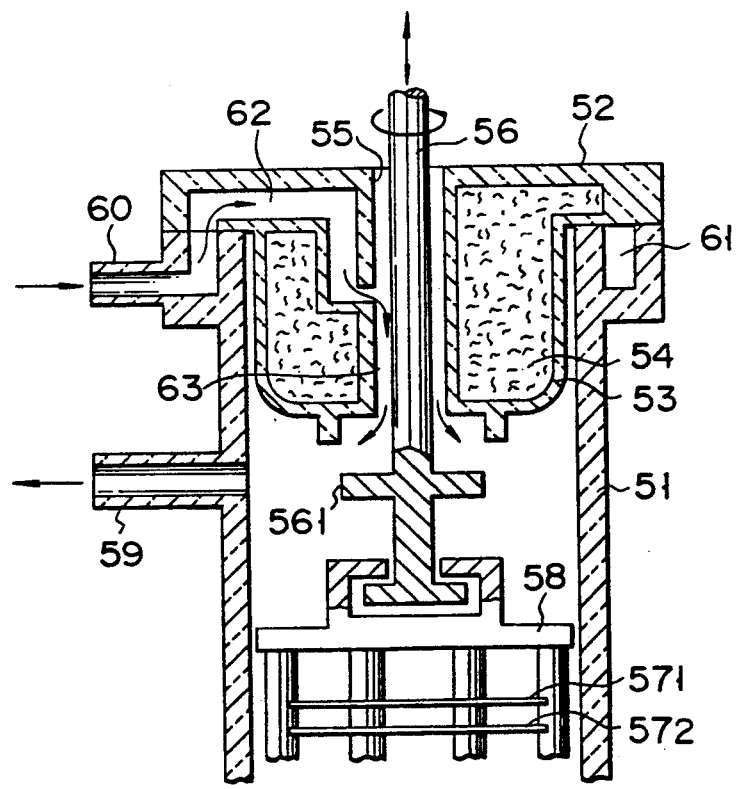
FIG. 4 is a sectional view showing an arrangement of a conventional heat-treatment apparatus.

By using the apparatus of the first embodiment shown in FIG. 1, the apparatus of the second embodiment shown in FIG. 2, and the conventional apparatus shown in FIG. 4, pyrogenic oxidation was performed on silicon substrates, and the distributions of thicknesses of oxide films formed on the surfaces of silicon substrates were checked as a position dependency in the boat. The check results will be described below.

As the oxidation conditions, a heat-treatment temperature was set at 950° C., hydrogen gas (4 liters/min.) and oxygen gas (5 liters/min.) were used as a heattreatment gas to be supplied from the injector 20 into the tube 11, and an oxidation time was set to be 12 minutes. 100 silicon substrates subjected to a cleaning treatment were set on the boat 17.

A heat-treatment was performed in the three apparatuses under the above same conditions. As a result, in the heat-treatment apparatus having the conventional structure shown n FIG. 4, oxide film thicknesses on central portions of the fifth silicon substrates from the top and bottom of the 100 silicon substrates set on the boat were 38.5 and 50.3 nm, respectively. A ratio of film thicknesses at the centers of 92 silicon substrates from the fifth substrate from the top to the fifth substrate from the bottom of the 100 substrates with respect to an average value of standard deviations was 9.2%.

In the heat-treatment apparatus of the first embodiment of the present invention, however, oxide film thicknesses on central portion of the fifth silicon substrates from the top and bottom of the 100 silicon substrates set on the boat 17 were 51.8 and 51.6 nm, respectively. In addition, in the heat-treatment apparatus according to the second embodiment of present invention, oxide film thicknesses on central portions of the fifth silicon substrate from the top and bottom of the 100 silicon substrates set on the boat 17 were 50.6 and 50.9 nm, respectively. That is, in the heat treatment apparatuses according to the first and second embodiments of the present invention, no reduction in oxidation rate was found on the silicon substrates mounted on the boat 17. When oxide film thicknesses formed on 92 silicon substrates from the fifth substrate from the top to the fifth substrate from the bottom of the 100 substrates in each apparatus of the first and second embodiments were measured, the ratios of standard deviations to an average value of standard deviations were 0.4% and 0.5%, respectively. Even when a maximum number of silicon substrates which can be processed at the same time are set, therefore, uniformly in the process is conspicuously improved, and the standard deviation is reduced to be about 1/20. When the heattreatment gas pressure in the heat-treatment tube and the heat-treatment temperature are maintained constant, an oxidation rate of silicon substrates set in the tube depends on the concentration of the heat-treatment gas as an oxidation species. In the heat-treatment apparatus having the structure shown in FIG. 4, therefore, since the sealing gas is supplied from the above, oxidation rates of silicon substrates set in an upper portion of a large number of silicon substrates mounted on the boat are lower than those of silicon substrates set in a lower portion.

Since the heat-treatment apparatuses according to the embodiments if the present invention can be used to perform processing for diffusing phosphorus in a silicon substrate by using, e.g., phosphorus oxychloride, the diffusion processing was performed by using the apparatus according to the first embodiment of the present invention and the conventional apparatus shown in FIG. 4, and the distributions of sheet resistances obtained after phosphorus was diffused in the silicon substrates were checked. In this experiment, 100 silicon substrates were set on the boat 17 and heattreated as in the case of oxide films described above, and a sheet resistance distribution on a central portion of each of 92 silicon substrates except for four silicon substrates in each of upper and lower portions of the 100 silicon substrates was evaluated. As a result, with respect to a target sheet resistance of about 10 ($\Omega/\square$), an average value and a ratio of standard deviation to the average value of the sheet resistances of a plurality of silicon substrates set in the conventional apparatus were 10.6 ($\Omega/\square$) and 23.3%, respectively. In the apparatus according to the first embodiment of the present invention, however, an average value and a ratio of standard deviation to the average value of the sheet resistances were 9.8 ($\Omega/\square$) and 2.1%, respectively. That is, uniformity in sheet resistance was conspicuously improved in a plurality of silicon substrates heattreated by the apparatus of the present invention. In this experiment, as the phosphorus diffusion conditions, a heat-treatment temperature was set at 950° C., a heat-treatment time was set to be 30 minutes, and phosphorus oxychloride was supplied in the heattreatment tube at a rate of about 100 mg/min.

Although the down-load type apparatus is exemplified in each of the above embodiments, a similar sealing structure can be adopted in an up-load type apparatus.

Figure 3:
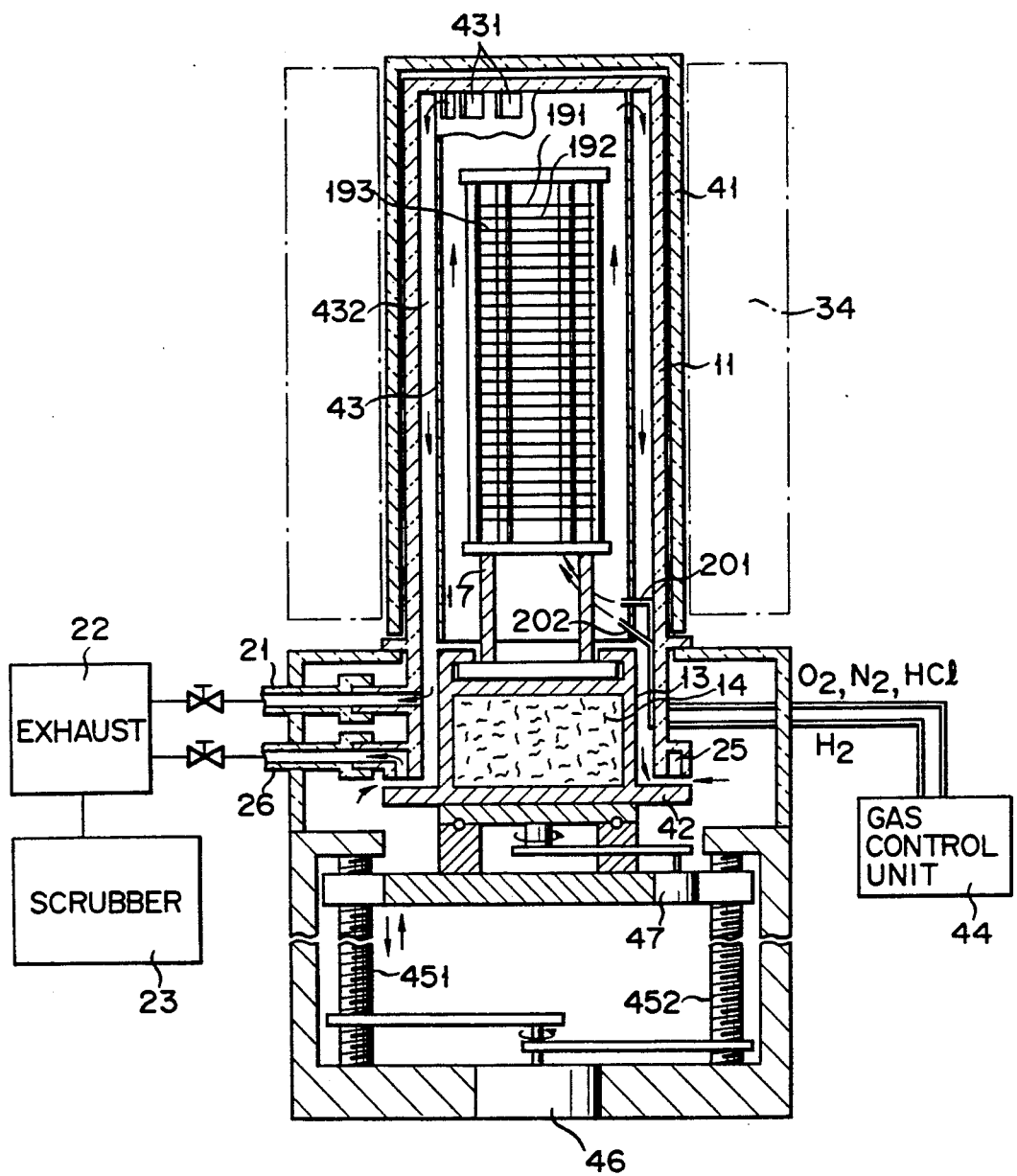
FIG. 3 is a sectional view for explaining a third embodiment of the present invention.

FIG. 3 shows a vertical heat-treatment apparatus of an up-load type, in which a heat-treatment tube 11 consisting of quartz has an opening portion in its lower surface. A silicon carbide tube 41 is coaxially formed outside the tube 11, and a heating mechanism 34 is formed outside the tube 41.

A heat-insulating base 42 is formed to oppose the lower opening surface of the tube 11. The base 42 consists of quartz, and a quartz wool 14 is filled in a chamber 13 formed integrally with the base 42, thereby constituting a heat-insulating structure. A boat 17 is placed on the heat-insulating base 42, and a large number of semiconductor wafers 191, 192, . . . , are supported by the boat 17. The boat 17 is inserted inside the tube 11 while the base 42 is set in an upper position as shows in FIG. 3.

A cylindrical member 43 is formed inside the tube 11 so as to surround the inserted boat 17, and the lower end portion of the member 43 is open. Openings 431 are formed around the upper end portion of the cylindrical member 43 so that the interior and the exterior of the member 43 communicate with each other. That is, a cylindrical gas path 432 is formed between the outer circumferential surface of the cylindrical member 43 and the inner circumferential surface of the tube 11.

Injectors 201 and 202 are open in a lower portion of the tube 11 to supply heat-treatment gases such as $O_2$, $N_2$, HCl, and $H_2$ gases form a gas control unit 44. The heat-treatment gases are supplied into the cylindrical member 43 from below the member 43. The heattreatment gases are flowed in contact with the semiconductor waters 191, 192, . . . , mounted on the boat 17 to an upper portion of the cylindrical member 43 and to the lower portion of the tube 11 through the gas path 432.

An exhaust duct 21 is formed in the lower side surface of the tube 11 to communicate with the gas path 432, and an exhaust duct 26 is formed therein to communicate with a ring-like chamber 25 formed around the lower opening portion of the tube 11. The exhaust ducts 21 and 26 are connected to an exhaust mechanism 22 via a control valve mechanism, and a gas exhausted by the exhaust mechanism is supplied to a scrubber 23.

The heat-insulating base 42 is supported by screws 451 and 452 and vertically moved by rotation of the screws 451 and 452 driven by a motor 46 via a chain. The base 42 is driven by a motor 47 to rotate the boat 17 supporting the semiconductor wafers 191, 192, . . . , inside the tube 11.

When the heat-insulating base 42 is rotated as described above, if a flange portion of the base 42 and the lower opening surface portion of the tube 11 are in contact with each other, particles are produced by friction between quartz materials of the two members. Therefore, movement of the heat-insulating base 42 is controlled such that a gap of about 1 mm is set between the base 42 and the opening surface of the tube 11 when the boat 17 is set in the tube 11 as shown in FIG. 3.

In the heat-treatment apparatus having the above arrangement, the gap is formed between the heatinsulating base 42 and the opening surface of the tube 11, and the external air flows from this gap portion. Since, however, the external air is exhausted from the chamber 25 to the exhaust duct 26, the ingress of air into the tube 11 can be prevented. Therefore, even when the boat 17 is rotated, the gas in the tube 11 is not exhausted to the atmosphere, and the external air is not mixed in the treatment gas in the tube 11.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A vertical heat-treatment apparatus for semiconductor parts, comprising:
   a heat-treatment tube having an interior, a lower portion, an opening in one portion thereof, and an opening surface located about the opening;
   a cap mounted on the opening surface of said heat-treatment tube;
   a rod for insertion into said heat-treatment tube through a central portion of said cap, the rod for holding semiconductor parts to be heat-treated at a heattreatment location;
   gas supply means for supplying a heat-treatment gas to a lower portion of said heat-treatment apparatus;
   first exhausting means for exhausting the gas in said heat-treatment tube from a location above the heat-treatment location, the first exhausting means for maintaining a pressure within the tube lower than external air pressure;
   an annular chamber surrounding the opening of the heat-treatment tube, the chamber having an annular opening arranged to be covered by the cap;
   a gas path formed between the interior of the tube and the annular chamber; and
   second exhausting means located in close proximity to the opening surface of said heat-treatment tube and communicating with the gas path, the second exhausting means for exhausting heat-treatment gas from the tube together with air existing in an area between the cap and the opening surface of the tube.

2. An apparatus according to claim 1, wherein said opening surface is located in an upper portion of the heattreatment tube said cap being located on said opening surface, and said rod being suspended from a location exterior to the cap.

3. An apparatus according to claim 1, wherein said opening surface is located in the lower portion of the heat-treatment tube, said cap is arranged to oppose said opening surface, and said rod holds semiconductor parts in an upper portion thereof, said rod being movable through the opening of the tube to introduce and remove semiconductor parts from said heat-treatment tube.

4. An apparatus according to claim 1, wherein an opening is formed in a central portion of said cap to communicate with the interior of said heat-treatment tube, and said rod is arranged to extend through said opening.

5. An apparatus according to claim 1, wherein said cap and said rod are integrally connected with each other.

6. An apparatus according to claim 1, wherein the cap includes an opening for communicating the interior of the tube with external air, the cap opening being formed in a central portion thereof for receiving said rod, said opening also communicating with said gas path.

7. A vertical heat-treatment apparatus for semiconductor parts, comprising:
- a heat-treatment tube having an interior, a substantially closed end, and an opened end having a tube opening located therein, the tube further including a chamber surrounding the tube opening, the chamber also having an opened end;
- a cap for covering the tube opening and the opened end of the chamber, the cap engaging the opened end of the tube in a manner that permits outside air to enter the chamber;
- a rod for insertion into the heat-treatment tube through a central portion of the cap, the rod for supporting semiconductor parts to be heat-treated at a heat-treatment location;
- gas supply means for supplying a heat-treatment gas to the interior of the tube from a position beneath the heattreatment location;
- gas path means for flow communicating the interior of the tube with the chamber surrounding the tube opening;
- means for exhausting outside air and heat-treatment gas from the chamber; and
- means, located above the heat-treatment location for exhausting gas from the interior of the tube.

8. An apparatus according to claim 7, wherein the means for exhausting gas from the interior of the tube is located between the heat treatment location and the opened end of the tube.

9. An apparatus according to claim 7, wherein the gas path means is formed in the cap.

10. An apparatus according to claim 7, wherein the cap and an interior wall of the tube cooperate to form the gas path means.

11. An apparatus according to claim 7, wherein the chamber exhausting means is at least one port disposed in a wall of the chamber.

12. An apparatus according to claim 7, wherein the means for exhausting gas from the interior of the tube is at least one port disposed in a wall of the tube.

13. An apparatus according to claim 7, wherein the cap includes an annular flange that extends into the chamber.

* * * * *